United States Patent
Combrie et al.

(10) Patent No.: US 10,917,047 B2
(45) Date of Patent: Feb. 9, 2021

(54) RADIO FREQUENCY OSCILLATOR AND ASSOCIATED SOURCE AND APPARATUS

(71) Applicants: THALES, Courbevoie (FR); UNIVERSITE PARIS-SACLAY, Saint-Aubin (FR); CENTRE NATIONAL DE LA RECHERCHE SCIENTIFIQUE, Paris (FR)

(72) Inventors: Sylvain Combrie, Palaiseau (FR); Alfredo De Rossi, Palaiseau (FR); Abdelmadjid Anane, Palaiseau (FR); Paolo Bortolotti, Palaiseau (FR)

(73) Assignees: THALES, Courbevoie (FR); UNIVERSITE PARIS-SACLAY, Saint-Aubin (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 16/652,326

(22) PCT Filed: Oct. 2, 2018

(86) PCT No.: PCT/EP2018/076870
§ 371 (c)(1),
(2) Date: Mar. 30, 2020

(87) PCT Pub. No.: WO2019/068740
PCT Pub. Date: Apr. 11, 2019

(65) Prior Publication Data
US 2020/0235703 A1 Jul. 23, 2020

(30) Foreign Application Priority Data

Oct. 2, 2017 (FR) ..................... 17 00998

(51) Int. Cl.
*H03B 17/00* (2006.01)
*H03B 21/01* (2006.01)

(52) U.S. Cl.
CPC ............ *H03B 17/00* (2013.01); *H03B 21/01* (2013.01); *H03B 2200/0016* (2013.01); *H03B 2200/0044* (2013.01)

(58) Field of Classification Search
CPC  G02F 2/00; G02F 2/002; H03B 17/00; H03B 21/00; H03B 21/01; H03B 21/02;
(Continued)

(56) References Cited

U.S. PATENT DOCUMENTS

2011/0150485 A1  6/2011  Seidel et al.

FOREIGN PATENT DOCUMENTS

WO     WO 2017/136459 A1   8/2017

OTHER PUBLICATIONS

Deych, L. et al., "Resonant enhancement of magneto-optical polarization conversion in microdisk resonators", Applied Physics Letters, American Institute of Physics, vol. 99, No. 24, 241107, pp. 241107-1-241107-4, XP012152689, (2011).
(Continued)

*Primary Examiner* — Levi Gannon
(74) *Attorney, Agent, or Firm* — Arent Fox LLP

(57) ABSTRACT

The present invention relates to a radiofrequency oscillator comprising an optical resonator being a ring waveguide allowing the propagation of a first wave in a first direction and of a second wave in a second direction, the second direction being opposite to the first direction, and the resonator comprising an active optical medium generating a first optical line from the first wave and a second optical line from the second wave, the resonator being in contact with a part made of a material featuring a magneto-optic effect, an applier of external magnetic field of adjustable intensity on
(Continued)

the resonator generating a frequency offset between the first wave and the second wave, and a processing circuit converting the beat between the two optical lines in a radiofrequency signal.

10 Claims, 2 Drawing Sheets

(58) Field of Classification Search
CPC .... H03B 2200/0016; H03B 2200/0044; H04B 2210/006
See application file for complete search history.

(56) References Cited

OTHER PUBLICATIONS

International Search Report, issued by International Searching Authority in corresponding International Application No. PCT/EP2018/076870, dated Dec. 5, 2018.
Wang, Z. et al., "Suppressing the effect of disorders using time-reversal symmetry breaking in magneto-optical photonic crystals: An illustration with a four-port circulator", Photonics and Nanostructures—Fundamentals and Applications 4, ELSEVIER, vol. 4, No. 3, pp. 132-140, (2006).

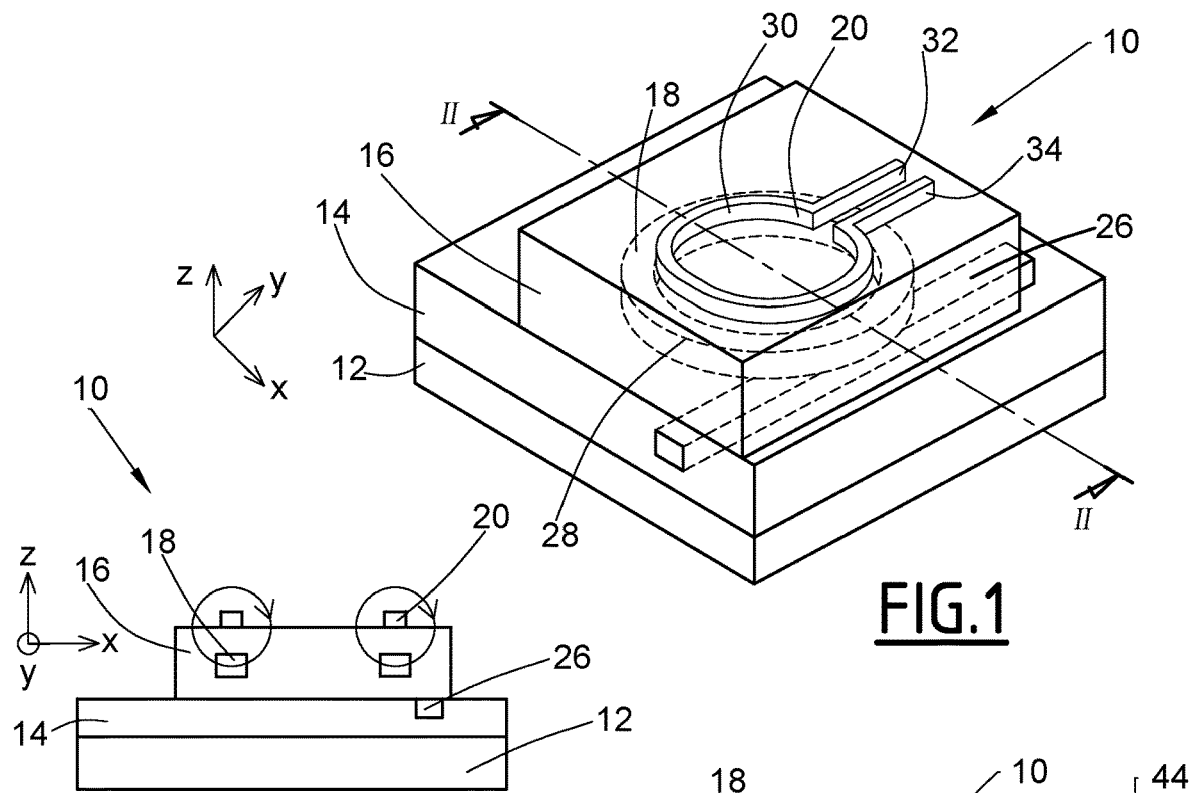
FIG.1
FIG.2
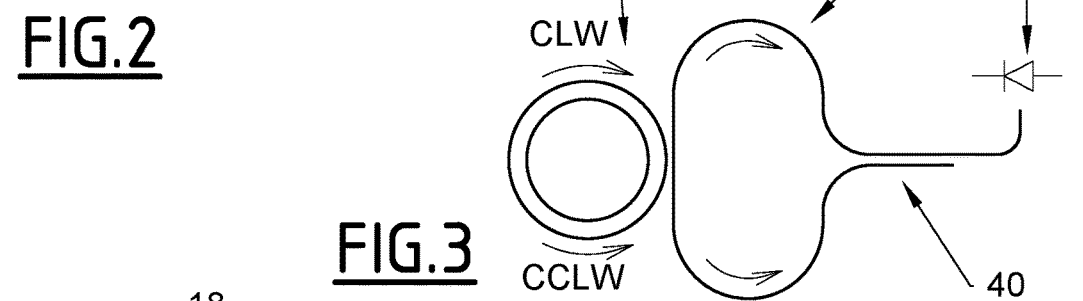
FIG.3
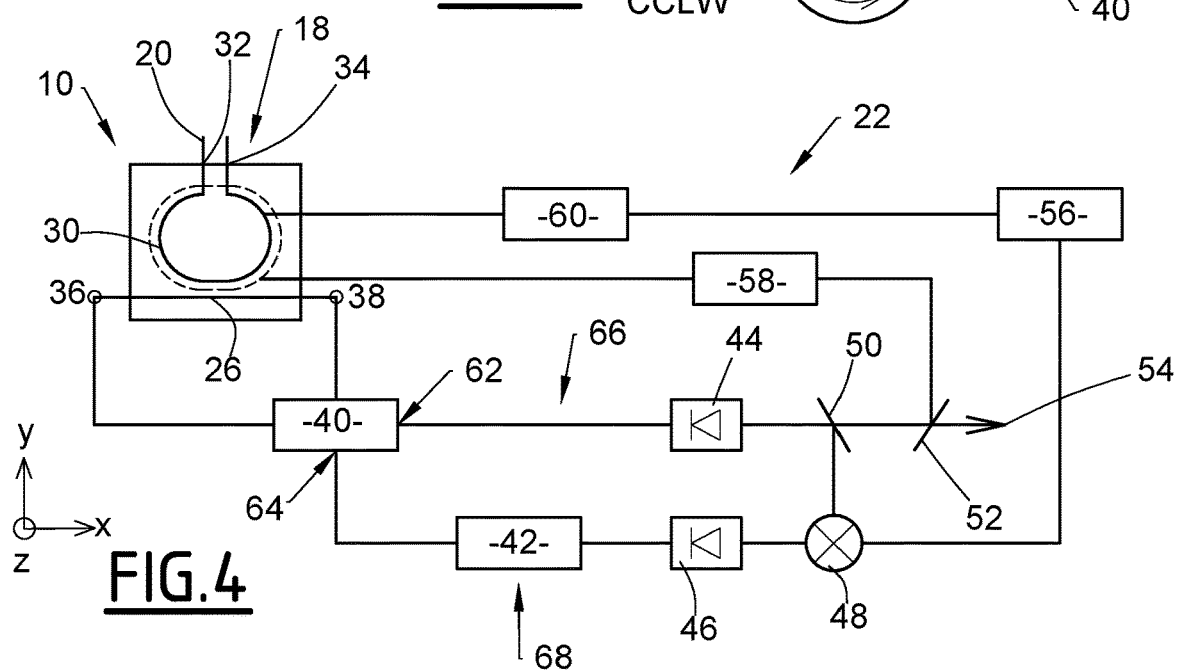
FIG.4

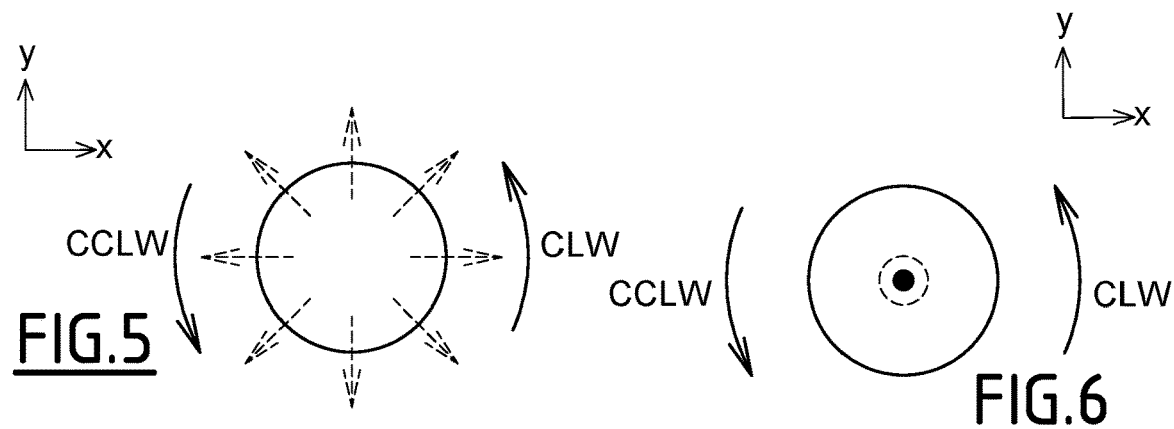
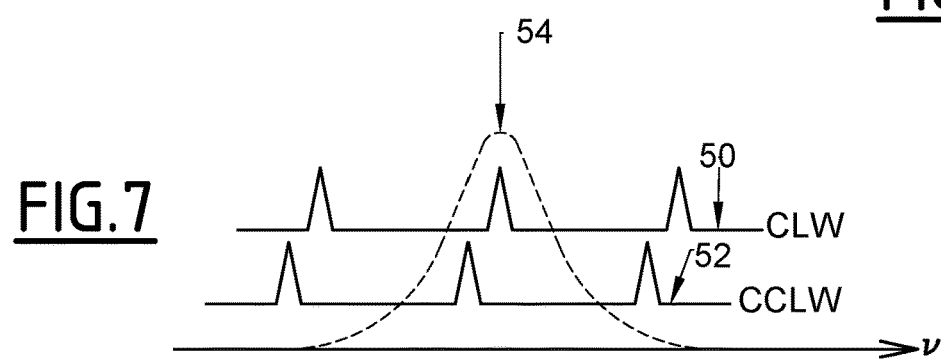
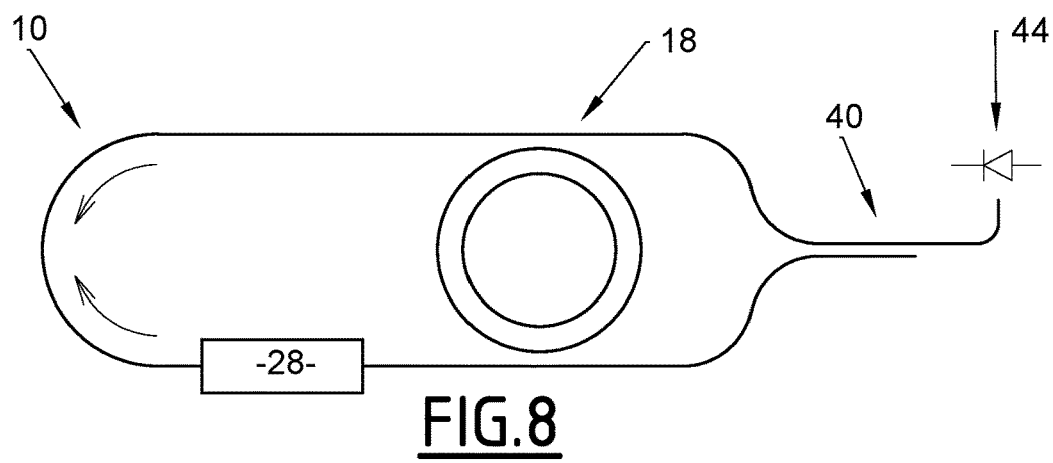
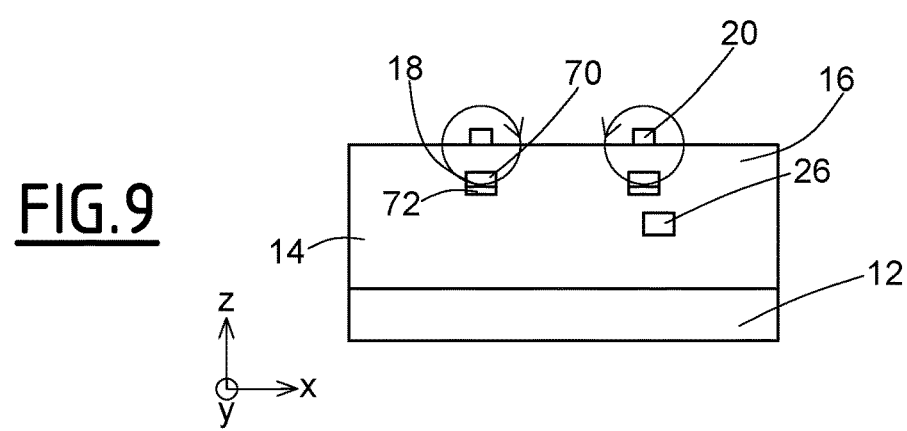

RADIO FREQUENCY OSCILLATOR AND ASSOCIATED SOURCE AND APPARATUS

CROSS-REFERENCE TO RELATED APPLICATIONS

This application is a National Stage Entry of International Patent Application No. PCT/EP2018/076870, filed Oct. 2, 2018, which claims priority to French Application No. 17 00998, filed on Oct. 2, 2017. The disclosures of the priority applications are incorporated in their entirety herein by reference.

The present invention relates to a radiofrequency oscillator. The present invention also relates to an associated source and apparatus.

For various applications, in particular for radar systems, communication systems and metrology, it is desirable to have radio frequency signal generators with high spectral purity and that may be used as local oscillators.

To generate radio frequency signals, it is known to use a quartz whose reference frequency is multiplied to reach a frequency range located in the GigaHertz (GHz).

However, such a device is cumbersome in particular because the monolithic integration of a quartz on a circuit poses technical problems, due to the quartz being a discrete element.

In addition, the frequency multiplication operation also leads to a multiplication of the noise due to the increase in the fluctuations involved. This is all the more true since the difference between the original frequency and the desired frequency is large.

Optical devices are also used. Such devices are based on the beat of two optical beams, the frequency spacing of which lies in the radio frequency domain.

A first approach is thus known which consists in causing the interference of two independent laser sources, which may be external lasers or produced on the same chip. Each laser is then independently subjected to fluctuations linked to local variations in temperature, gain or beat with parasitic modes. As the two noise sources are independent due to the physical separation, the noise relates directly to the frequency generated.

The first approach consisting in using the beat of two independent laser sources, is thus limited by the fluctuations inherent in each source which relate directly to the beat signal.

According to a second approach using a "dual-frequency laser", a laser operating simultaneously in two modes is used, the spectral spacing of which corresponds to the desired frequency. In this case, the two modes share the same cavity and the same gain medium. The fluctuations are then common giving correlation of the fluctuations. The frequency difference is then largely stabilized. One such type of laser has been developed with solid state technology. The distance between modes is controlled by applying a voltage across a birefringent element inserted into the laser cavity.

Nevertheless, significant control voltages (up to 100 volts) have to be used in the second approach.

In addition, discrete components are used in both approaches, which implies a relatively cumbersome system.

Therefore, there is a need for a radiofrequency source offering more compactness and better stability.

To this end, the present description relates, in particular, to a radiofrequency oscillator comprising an optical resonator in the form of a ring waveguide allowing the propagation of a first wave in a first direction and of a second wave in a second direction, wherein the second direction is opposite to the first direction, wherein the resonator comprises an active optical medium generating a first optical line from the first wave and a second line from the second wave, the resonator being in contact with a part made of a material featuring a magneto-optic effect. The radiofrequency oscillator includes an external magnetic field applier of adjustable intensity on the resonator to generate a frequency offset between the first wave and the second wave, and a processing circuit converting the beat between the two optical lines into a radiofrequency signal.

According to particular embodiments, the radiofrequency oscillator comprises one or more of the following characteristics, taken in isolation or in any technically feasible combination:

- the material featuring magneto-optical effect is yttrium and iron garnet, or yttrium and iron garnet doped with a ferromagnetic, paramagnetic, ferrimagnetic or metallic element.
- the processing circuit is made in silicon technology.
- the applier is suitable for applying a magnetic field perpendicular to the ring waveguide when the two waves propagate in transverse electrical polarization.
- a center is defined for the resonator, the applier being adapted to apply a radial magnetic field relative to the center of the resonator when the two waves propagate in transverse magnetic polarization.
- the part made of a material featuring a magneto-optic effect is part of the resonator and is in contact with the active optical medium.
- the oscillator further comprises amplitude stabilization in frequency and in phase.
- the active optical medium is positioned so that the resonator is an extended cavity.

The present description also relates to a radiofrequency source comprising a radiofrequency oscillator as previously described.

The present description also relates to an apparatus comprising a radiofrequency source as previously described.

Other characteristics and advantages of the invention will become apparent upon reading the following description of embodiments of the invention, given by way of example only and with reference to the drawings, which are:

FIG. 1, a perspective view of an example of a radio frequency oscillator comprising, in particular, a ring resonator, an optical extraction guide and an electric loop;

FIG. 2, a view of the oscillator of FIG. 1, the view being a sectional view along the line II-II of FIG. 1;

FIG. 3, a schematic view of a portion of the oscillator of FIG. 1 incorporating an optical circuit and a photodetector suitable for converting optical oscillation in the radio frequency domain;

FIG. 4, a schematic view of another part of the oscillator of FIG. 1 incorporating the stabilization loops;

FIG. 5, a schematic view of a magnetic field applied to the ring resonator according to a first configuration;

FIG. 6, a schematic view of a magnetic field applied to the ring resonator according to a second configuration;

FIG. 7, a graphical view illustrating the mechanism of the Faraday effect on the spectrum of the resonator, FIG. 8, a schematic view of part of another example of a radiofrequency oscillator comprising a ring resonator, and FIG. 9, a schematic view of part of yet another example of a radio frequency oscillator having a ring resonator.

A radiofrequency oscillator 10 is shown in FIG. 1.

An oscillator 10 is a device capable of generating oscillations having a fixed or controlled frequency at one or more outputs.

An oscillator 10 is a radiofrequency oscillator 10 when the frequency of the oscillations is a radiofrequency, i.e. a frequency between 3 kiloHertz (kHz) and 300 GHz.

The oscillator 10 is a stack of layers, especially visible in FIGS. 1 and 2.

A stacking direction is defined for the remainder. The stacking direction is symbolized in the figures by an axis Z. The stacking direction is therefore designated by the expression "stacking direction Z" in the rest of the description.

A first transverse direction is also defined. As shown in FIG. 2, the first transverse direction is perpendicular to the stacking direction Z and contained in the plane of the sheet. The first transverse direction is symbolized in the figures by an axis X. The first transverse direction is therefore designated by the expression "first transverse direction X" in the rest of the description.

A second transverse direction is also defined as being perpendicular to the stacking direction Z and to the first transverse direction X. The second transverse direction is symbolized in the figures by a Y axis. The second transverse direction is therefore designated by the expression "second transverse direction Y" in the rest of the description.

The oscillator 10 is therefore a stack of three layers in the stacking direction Z: a first layer 12, a second layer 14, and a third layer 16.

The first layer 12 is a silicon substrate. Such silicon substrates make it possible to integrate both optical and electronic components.

The second layer 14 is interposed between the first layer 12 and the third layer 16.

The second layer 14 is made of a dielectric material with a low optical index.

In this context, a material with a low optical index is a material having, at a wavelength of 1.5 μm (micrometer), an index lower than the optical guiding layer (resonator) and ideally close to 1.

According to the example described, the insulating material is $SiO_2$.

The oscillator 10 comprises a resonator 18, a magnetic field applier 20, a processing circuit 22 and an extraction guide 26.

The resonator 18 is an optical resonator of the micro-ring type.

In other words, the resonator 18 is a waveguide having a ring shape. Alternatively, the resonator 18 may have the shape of a micro-disc.

By "ring" is meant the shape of a ring in the broad sense so that a waveguide having a substantially oblong shape is also considered to be a ring. Such a waveguide is often referred to as a "racetrack".

A first radius R1 is defined for the resonator 18.

A center is also defined for the resonator 18.

The resonator 18 allows the propagation of a first wave in a first direction and of a second wave in a second direction, the second direction being opposite to the first direction.

The first wave in the first direction corresponds to a mode propagating clockwise. This mode is sometimes referred to as CLW for "clockwise". It is therefore designated CLW mode in the following description.

The second wave in the second direction corresponds to a mode propagating counterclockwise. This mode is sometimes referred to as CCLW for "counterclockwise". It is therefore designated CCLW mode in the following description.

The resonator 18 is in contact with a part made of a material featuring a magneto-optical effect.

By definition, a magneto-optical material has an asymmetric refractive index. As a result, the expression "non-reciprocal material" is sometimes used to designate such a type of material.

Typically any material with magnetic polarization may exhibit this property.

For example, according to the example described, the material featuring a magneto-optical effect is yttrium and iron garnet, of formula $Y_3Fe_5O_{12}$, commonly known by its acronym YIG.

Alternatively, the material featuring a magneto-optical effect may be YIG doped with a ferromagnetic, paramagnetic, ferrimagnetic or metallic element.

By the term "doped" is meant broad acceptance including substitutions with the elements previously mentioned. Doping allows an increase in the magneto-optic efficiency of the YIG.

Ferromagnetism designates the capacity of certain bodies to magnetize under the effect of an external magnetic field and to retain part of this magnetization.

In magnetism, paramagnetism designates the behavior of a material medium which does not feature spontaneous magnetization but which, under the effect of an external magnetic field, acquires magnetization directed in the same direction as this field of excitation.

Ferrimagnetism is a magnetic property of certain solid bodies. In a ferrimagnetic material, the magnetic moments are anti-parallel but of different amplitude. This results in spontaneous magnetization of the material.

Among the magnetic elements, nickel, cobalt, iron or a nickel-cobalt-iron alloy is of interest in this context.

According to a particular example, the material featuring a magneto-optic effect is YIG doped with cerium (often designated by the acronym Ce:YIG) or YIG doped with bismuth (often designated by Bi:YIG).

In the example of FIG. 1, the part made of a material featuring a magneto-optic effect is the third layer 16.

The resonator 18 also comprises an active optical medium 28.

The active optical medium 28 is capable of generating a first optical line from the first wave and a second line from the second wave.

More generally, an active optical medium 28 is a medium capable of generating gain for a wave passing through the optical medium over a range of predefined wavelengths.

In the example shown, the ring resonator 18 is the active optical medium 28. This implies, in particular, that the active optical medium 28 is embedded in the third layer 16.

The active optical medium 28 is, for example, made of III-V material.

It will be recalled that a "III-V" type semiconductor is a composite semiconductor made from one or more elements of column III of the periodic table of the elements (boron, aluminum, gallium, indium, etc. . . . ) and one or more elements of column V or pnictogens (nitrogen, phosphorus, arsenic, antimony . . . ).

For example, the active optical medium 28 is a quantum well.

The extraction guide 26 is coupled to the optical resonator 18.

In the example of FIG. 2, the extraction guide 26 has a rectilinear shape and extends mainly along the second transverse direction Y.

Alternatively, the extraction guide 26 may have a curved (or "looped") shape to take advantage of a filtering effect from the other modes propagating in the resonator 18.

In the case of FIG. 1, the extraction guide 26 is a passive silicon waveguide.

The resonator 18 is located in the third layer 16 while the extraction guide 26 is part of the second layer 14.

The applier 20 is an applier 20 of an external magnetic field of adjustable intensity on the optical resonator 18.

The applier 20 is capable of generating a frequency offset between the first wave (CLVV) and the second wave (CCLVV).

In the example described, the applier 20 is a current loop.

Alternatively, the applier may have a plurality of turns.

More specifically, as shown in FIG. 1, the applier 20 may have a central part 30 and two supply pads 32 and 34.

The two supply pads 32 and 34 are rectilinear portions extending along the second transverse direction Y.

The middle part 30 has a quasi-closed ring shape connecting two ends of the two supply pads 32 and 34.

As may be seen in FIG. 5, the applier 20 is suitable for applying a magnetic field oriented radially with respect to the center of the ring resonator 18 when the two waves propagate according to a transverse magnetic polarization.

The applier 20 is also suitable for applying a magnetic field perpendicular to the ring resonator 18 when the two waves propagate in electrical transverse polarization (see FIG. 6).

The applier 20 is deposited on the third layer 16 as seen in FIG. 2.

The applier 20 is supplied by a current source not shown in the figures.

The processing circuit 22 is visible in FIG. 4.

The processing circuit 22 is produced using silicon technology.

The processing circuit 22 performs several functions in the example of FIG. 1, namely converting the beat between the two optical lines into a radiofrequency signal and ensuring the amplitude and phase stability of the oscillator 10.

The processing circuit 22 has two inputs 36 and 38, a coupler 40, a delay line 42, two detectors 44 and 46, a comparator 48, two separators 50 and 52, an output 54, a filter 56, a gain corrector 58 and a phase corrector 60.

The two inputs 36 and 38 of the processing circuit 22 are connected, on the one hand, to the extraction guide 26 and, on the other hand, to the coupler 40.

The coupler 40 is a directional coupler.

The coupler 40 has two outputs 62 and 64 allowing two optical channels 66 and 68 to be defined.

Alternatively, instead of the directional coupler 40, an "MMI" type coupler may be used. The acronym "MMI" means "multimode interference".

The first optical channel 66 is connected to the first detector 44.

The first detector 44 is capable of converting the beat between the two optical lines into a radiofrequency signal.

The first detector 44 is thus a photodetector.

For example, the first detector 44 may be a photodiode.

In the example described, the first detector 44 is produced using silicon technology.

In the case of FIG. 4, the first detector 44 is a silicon-germanium type photodiode.

The second optical channel 68 comprises the delay line 42 and the second detector 46.

The delay line 42 is an optical delay line introducing a delay between the first channel and the second channel.

For example, the delay line 42 may be an optical fiber.

Alternatively, the delay line 42 may be a waveguide produced in SiN.

The second detector 46 is similar to the first detector 44. The remarks made for the first detector 44 also apply to the second detector 46.

The first separator 50 is able to separate the signal from the first detector 44 into a part of the signal sent to the comparator 48 and another part sent to the second separator 52.

The comparator 48 is able to compare the signals of the two optical channels 66 and 68, so as to generate a comparison signal.

The filter 56 is able to filter the comparison signal to obtain a filtered signal.

According to the example described, the filter 56 is a low-pass filter.

The filter 56 is connected to the phase corrector 60.

The phase corrector 60 is able to control the current flowing in the applier 20.

The phase corrector 60 is a servo circuit.

The second separator 52 is able to separate the signal from the first separator 50 into a part sent to the gain corrector 58 and another part sent to the output 54 of the processing circuit 22.

The output 54 of the processing circuit 22 corresponds to the output of the oscillator 10.

The gain corrector 58 is able to control the gain of the active optical medium 28.

The gain corrector 58 is, for example, a "PID" servo type, the acronym PID meaning "Proportional, Integrator, Derivative".

The operation of the oscillator 10 is now described below.

In a simplified manner, two optical waves, associated with a resonance mode, circulate in opposite directions in the resonator 18 which integrates the material featuring a magneto-optic effect.

As illustrated in FIG. 7, the application of the magnetic field, by modifying the non-reciprocity of the material, makes it possible to control the frequency separation of the resonances in a doubly degenerate optical mode.

The beat on a detector 44 or 46 of the CLW and CCLW modes propagating in opposite directions, generates a periodic signal in the electrical domain.

To explain this point, the well-established principle of optical signal synthesis should be recalled here. The electrical spectrum of the signal generated by a photodiode detecting the emission of the two laser sources is a sinusoid whose frequency corresponds to the spectral spacing. This approach covers a very wide frequency range from GigaHertz to TeraHertz, the only limitation being the response time of the photodetector.

The phase and amplitude fluctuations of each source add up in amplitude if the sources are not correlated, which is the case for two independent laser sources.

On the other hand, if the two sources share the same cavity, the fluctuations are the same, insofar as the two modes are as close as possible, i.e. feature the closest spatial distribution.

In the case of a ring resonator 18, any mode is doubly degenerated in frequency, according to the direction of propagation (CLW or CCLVV). The overlap between these two modes is maximum. The two resonances are strictly identical and follow the same fluctuations, in the absence of a non-reciprocal effect.

The addition of a material featuring a magneto-optic effect (Faraday type) makes it possible to reverse the degeneration and to obtain a signal during the conversion in the electrical field. Only the fluctuations of the magnetic field translate into a frequency fluctuation.

In the case described, there are two possible configurations for applying the control as shown in FIGS. 5 and 6.

In the example in FIG. 5, the two modes CLW and CCLW propagate according to a transverse magnetic polarization. The applier 20 then applies a radial magnetic field relative to the center of the resonator 18.

According to the case of FIG. 6, the two modes CLW and CCLW propagate according to an electric transverse polarization. The applier 20 then applies a magnetic field perpendicular to the resonator 18.

In each case, the application of an external magnetic field, oriented radially for a transverse magnetic propagation and oriented to normal for a transverse electrical propagation causes an anisotropy responsible for a spectral shift of the resonance. This shift has an opposite sign between the first CLW mode and the second CCLW mode.

In both cases, the oscillator 10 uses a magneto-optic material making it possible to make the propagation of an optical wave in the resonator 18 non-reciprocal in the direction of rotation. The beat of the two optical frequencies in a fast detector allows conversion in the electrical field. This mechanism is illustrated in particular in FIG. 7 where the frequency comb 50 is associated with the first propagation mode CLW, the frequency comb 52 is associated with the second CCLW mode, and the gain curve 54 is associated with the active optical medium 28.

The oscillator 10 has properties in terms of tunability similar to the case of the dual-frequency laser.

The oscillator 10 makes it possible to have a compact source, i.e. a source greatly reduced in size and cumbersomeness.

In fact, the source may be integrated on an integrated photonic circuit. In particular, the oscillator 10 is of a nature compatible with a silicon photonic platform.

In addition, the technology implemented, based on integrated photonic circuitry (on silicon) which feature elements made of III-V materials and a non-reciprocal magnetic material, is compatible with other integrated functionalities on the chip, offering a wide range of applications.

In addition, the counterpropagative and copropagative modes originating from the same mode (degenerated by the magnetic field) causes the overlap of the two modes to be almost perfect, which leads to improved noise correlation.

In other words, the modes associated with the two directions of propagation, being quasi-degenerate, are in essence very close and, sharing the same environment, undergo the same environmental fluctuations. Being correlated, the frequency difference results in greatly reduced noise.

Furthermore, the oscillator 10 has reduced phase noise and reduced amplitude noise, so that the oscillator 10 is more stable.

The oscillator 10 is also rapidly reconfigurable since control is carried out by controlling the current in the applier 20.

An integrated, agile and high spectral purity radiofrequency oscillator 10 is thus proposed, through the use of a magneto-optic material which is easy to manufacture.

In particular, the techniques traditionally used in the field of integrated photonics are sufficient to manufacture such an oscillator 10. Typically, the resonator 18 is bonded to a silicon chip, while a second transfer or direct deposition allows the material featuring a magneto-optic effect to be disposed.

FIG. 8 shows another embodiment of the oscillator 10.

The oscillator 10 according to FIG. 8 is similar to the oscillator 10 according to FIG. 1 so that only the differences are specified below. The remarks which apply to both the oscillators 10 in FIG. 1 and in FIG. 8 are not repeated below.

The active optical medium 28 is positioned so that the resonator 18 is an extended cavity.

This means that the active medium 28 is positioned outside the ring waveguide. In such a configuration, the resonator 18 has two separate parts: the ring waveguide and the active medium 28, wherein the assembly forms an extended cavity.

This configuration allows certain applications to increase the laser power in the gain zone.

In addition, it is feasible to use an extraction guide 26 made of nitride allowing higher power densities.

FIG. 9 shows another embodiment of the oscillator 10.

The oscillator 10 according to FIG. 9 is similar to the oscillator 10 according to FIG. 1, so that only the differences are specified below. The remarks which apply to both the oscillators 10 in FIG. 1 and in FIG. 9 are not repeated below.

In the embodiment of FIG. 9, the second layer 14 and the third layer 16 are combined and made of a dielectric material of low index.

The resonator 18 is a ring waveguide comprising a first part 70 and a second part 72. The two parts 70 and 72 have the same ring shape.

The first part 70 surmounts the second part 72, the two parts 70 and 72 being in contact over the whole of the ring.

The first part 70 is made of III-V material while the second part 72 is made of material featuring a magnetic-optic effect.

In general, the part made of the material featuring a magnetic-optic effect is positioned so as to influence the optical wave propagating in the ring waveguide, either by modifying the evanescent part of the optical field (in particular in FIG. 1), or by directly modifying the guiding structure (case of FIG. 9).

The direct modification of the guiding structure makes it possible to maximize the anisotropic effect because the optical modes then have very good coverage with the Faraday medium.

The oscillator 10 presented is advantageously usable for numerous applications.

In a particular example, a radio frequency source includes such an oscillator 10.

The source may then be used for electronic devices such as frequency synthesizers, electric spectrum analyzers and local oscillators for coherent receivers.

The invention also relates to all the technically feasible combinations of the embodiments previously described.

The invention claimed is:

1. Radiofrequency oscillator comprising:
   an optical resonator being a ring waveguide allowing propagation of a first wave in a first direction and of a second wave in a second direction, the second direction being opposite to the first direction, and the resonator comprising an active optical medium generating a first optical line from the first wave and a second optical line from the second wave,
   the resonator being in contact with a part made of a material featuring a magneto-optic effect,
   an external magnetic field applier of adjustable intensity on the resonator generating a frequency offset between the first wave and the second wave, and
   a processing circuit converting the beat between the two optical lines into a radiofrequency signal.

2. An oscillator according to claim 1, in which the material featuring a magneto-optic effect is yttrium and iron garnet or yttrium and iron garnet doped with a ferromagnetic, paramagnetic, ferrimagnetic or metallic element.

3. Oscillator according to claim 1, wherein the processing circuit is made using silicon technology.

4. Oscillator according to claim 1, wherein the applier is adapted to apply a magnetic field perpendicular to the ring waveguide when the two waves propagate in electrical transverse polarization.

5. Oscillator according to claim 1, in which a center is defined for the resonator, the applier being adapted to apply a radial magnetic field relative to the center of the resonator when the two waves propagate in transverse magnetic polarization.

6. Oscillator according to claim 1, wherein the part made of a material featuring a magneto-optic effect is part of the resonator and is in contact with the active optical medium.

7. Oscillator according to claim 1, wherein the oscillator further comprises stabilization in amplitude, in frequency and in phase.

8. Oscillator according to claim 1, in which the active optical medium is positioned so that the resonator is an extended cavity.

9. Radiofrequency source comprising a radiofrequency oscillator according to claim 1.

10. Device comprising a radiofrequency source according to claim 9.

* * * * *